(12) United States Patent
Lee et al.

(10) Patent No.: US 7,315,063 B2
(45) Date of Patent: Jan. 1, 2008

(54) CMOS TRANSISTOR AND METHOD OF MANUFACTURING THE SAME

(75) Inventors: Young-eun Lee, Goyang-si (KR);
Seong-ghil Lee, Seongnam-si (KR);
Yu-gyun Shin, Seongnam-si (KR);
Jong-wook Lee, Yongin-si (KR);
Young-pil Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/363,176

(22) Filed: Feb. 28, 2006

(65) Prior Publication Data

US 2006/0292783 A1 Dec. 28, 2006

(30) Foreign Application Priority Data

Feb. 28, 2005 (KR) ............... 10-2005-0016722

(51) Int. Cl.
*H01L 29/76* (2006.01)
(52) U.S. Cl. ............... 257/338; 257/69; 257/204; 257/357
(58) Field of Classification Search ........ 257/338, 257/369
See application file for complete search history.

(56) References Cited

U.S. PATENT DOCUMENTS

| | | | |
|---|---|---|---|
| 6,605,498 B1 | 8/2003 | Murthy et al. | |
| 6,656,853 B2 | 12/2003 | Ito | |
| 6,703,271 B2 | 3/2004 | Yeo et al. | |
| 6,730,551 B2 | 5/2004 | Lee et al. | |
| 6,734,527 B1 | 5/2004 | Xiang | |
| 7,118,952 B2* | 10/2006 | Chen et al. ........ | 438/199 |
| 2005/0035470 A1 | 2/2005 | Ko et al. | |
| 2005/0082616 A1* | 4/2005 | Chen et al. ........ | 257/350 |
| 2005/0179066 A1* | 8/2005 | Murthy et al. ..... | 257/288 |

FOREIGN PATENT DOCUMENTS

| | | |
|---|---|---|
| JP | 10092947 | 4/1998 |
| JP | 2003179157 | 6/2003 |
| KR | 10-2003-0082538 | 10/2003 |

* cited by examiner

*Primary Examiner*—Jack Chen
(74) *Attorney, Agent, or Firm*—Volentine & Whitt, PLLC

(57) ABSTRACT

A CMOS transistor structure and related method of manufacture are disclosed in which a first conductivity type MOS transistor comprises an enhancer and a second conductivity type MOS transistor comprises a second spacer formed of the same material as the enhancer. The second conductivity type MOS transistor also comprises a source/drain region formed in relation to an epitaxial layer formed in a recess region.

15 Claims, 7 Drawing Sheets

CMOS TRANSISTOR AND METHOD OF MANUFACTURING THE SAME

BACKGROUND OF THE INVENTION

1. Field of the Invention

Embodiments of the invention relate to a Complementary Metal Oxide Semiconductor (CMOS) transistor and a related method of manufacture. More particularly, embodiments of the invention relate to a CMOS transistor formed from a simplified manufacturing process yielding simultaneous improvements in the performance properties of first and second conductivity type MOS transistors, and a related method of manufacture.

This application claims priority to Korean Patent Application No. 10-2005-0016722 filed on Feb. 28, 2005, the subject matter of which is hereby incorporated by reference.

2. Description of the Related Art

As semiconductor devices have become more highly integrated, the length of the gate in constituent MOS transistor has been progressively reduced. As the gate length in MOS transistors has been reduced, the effective length of the corresponding channel region for the MOS transistors has also been reduced. As the length of the channel region in MOS transistors is reduced, the effect of the source/drain region(s) on the electric field (or voltage potential) associated with the channel region increases. This result is referred to as the "short channel effect." The negative performance impact of the short channel effect is particularly pronounced in PMOS transistors.

Thus, a variety of methods have been proposed to improve the performance of MOS transistors having reduced gate (and channel) lengths. Among these are methods that create a strain in order to increase mobility of electrical carriers (e.g., electrons and/or holes) by applying a tensile or compressive force to the channel region below the gate.

Representative of methods of creating strain is one method in which a tensile force is generated in the channel region of an NMOS transistor by varying the type and thickness of a layer acting as an etch stop layer during a process step(s) adapted to form a contact hole. In another method, the source/drain region of a PMOS transistor is recessed, and then the recessed region is filled with silicon germanium (SiGe). Since SiGe has a larger lattice constant than silicon (Si), which has a lattice constant of 5.43 Å, the in-fill of SiGe using a selective epitaxial growth (SEG) technique will generate a compressive force in the channel region. This type of method is disclosed, for example, by T. Ghani, M. Armstrong, et al., in an article entitled "A 90 nm High Volume Manufacturing Logic Technology Featuring Novel 45 nm Gate Length Strained Silicon CMOS Transistors," (IEEE, 2003).

Thus, generally speaking, one type of strain is effective in the creation of a strain in NMOS transistors while another type of strain is effective in the creation of strain in PMOS transistors. That is, the performance properties of the respective channel regions in NMOS and PMOS transistors react differently to different strain types (e.g., compressive or tensile). However, a CMOS transistor structure comprises both NMOS and PMOS transistors. Thus, application of one remedy intended to improve the performance of the channel region in a PMOS transistor may actually impair the performance of the channel region in the NMOS transistor, and vice verses.

SUMMARY OF THE INVENTION

Embodiments of the invention provide a Complementary Metal Oxide Semiconductor (CMOS) transistor having improve performance properties for both first and second conductivity type transistors, and such improvement comes by way of a simplified manufacturing process.

Thus, in one embodiment, the invention provides a CMOS transistor comprises; first and second conductivity type transistors formed on a semiconductor substrate, wherein the first conductivity type transistor comprises; a gate electrode structure formed on the semiconductor substrate, a first spacer formed on sidewalls of the gate electrode structure, a first conductivity type low-concentration source/drain region aligned with a sidewall of the gate electrode structure and formed in the semiconductor substrate, a first conductivity type high-concentration source/drain region aligned with a sidewall of the first spacer and formed in the semiconductor substrate in electrical contact with the first conductivity type low-concentration source/drain region, and an enhancer formed on the gate electrode structure, first spacer, first conductivity type low-concentration source/drain region and first conductivity type high-concentration source/drain region. The second conductivity type transistor comprises; a gate electrode structure formed on the semiconductor substrate, a first spacer formed on sidewalls of the gate electrode structure, a second spacer formed at least in part on the first spacer and formed from the same material used to form the enhancer, a second conductivity type low-concentration source/drain region aligned with a sidewall of the gate electrode structure and formed in the semiconductor substrate, an epitaxial layer formed to fill least in part a recess in the semiconductor substrate aligned with a sidewall of the second spacer, and a second conductivity type high-concentration source/drain region formed in the semiconductor substrate under the epitaxial layer.

In one related aspect of this embodiment, the enhancer is formed from a tensile force or compressive force-generating material.

In another embodiment, the invention provides a method of manufacturing a CMOS transistor, the method comprising; forming first and second active regions in a semiconductor substrate, forming a first gate electrode structure on the first active region and a second gate electrode structure on the second active region, forming a first conductivity type low-concentration source/drain region aligned with a sidewall of the first gate electrode structure in the semiconductor substrate, forming a second conductivity type low-concentration source/drain region aligned with a sidewall of the second gate electrode structure in the semiconductor substrate, forming a first spacer on each the respective sidewalls of the first and second gate electrode structures, forming a first conductivity type high-concentration source/drain region aligned with a sidewall of the first spacer formed on the first gate electrode structure; and thereafter forming an enhancer on the semiconductor substrate, selectively etching the enhancer proximate the second gate electrode structure to form a second spacer formed on the first spacer formed on the second gate electrode structure and to form a recess region in the semiconductor substrate aligned along sidewalls of the second spacer, forming an epitaxial layer to fill at least in part the recess region, and forming a second conductivity type high-concentration source/drain region in the semiconductor substrate under the epitaxial layer.

BRIEF DESCRIPTION OF THE DRAWINGS

Several embodiments of the invention will be described with reference to the attached drawings in which.

DESCRIPTION OF EXEMPLARY EMBODIMENTS

Figure 1:
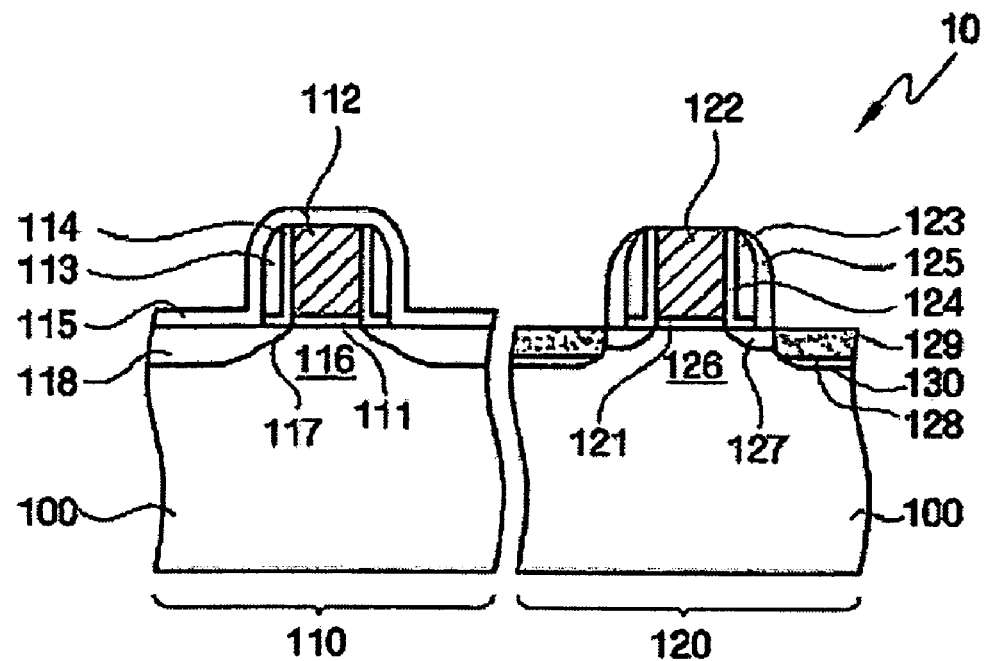
FIG. 1 is a cross-sectional view of a Complementary Metal Oxide Semiconductor (CMOS) transistor according to an embodiment of the present invention.

Advantages and features of the present invention and methods of accomplishing the same will be understood by reference to the following description of embodiments with reference to the accompanying drawings. It should be noted, however, that the invention may be embodied in many different forms and should not be construed as being limited to only the embodiments set forth herein. Rather, these embodiments are provided as teaching example. Throughout the specification and drawings, like reference numerals refer to like or similar elements.

A exemplary Complementary Metal Oxide Semiconductor (CMOS) transistor and a related method of manufacture according to embodiments of the invention will now be described with reference to FIGS. 1 through 11.

FIG. 1 is a cross-sectional view of a Complementary Metal Oxide Semiconductor (CMOS) transistor according to an embodiment of the present invention. Referring to FIG. 1, a CMOS transistor 10 includes a first conductivity type MOS transistor comprising an enhancer 115 formed on a semiconductor substrate 100 in a first active region 110, and a second conductivity type MOS transistor comprising a double spacer of first and second spacers 123 and 125 and a source/drain region 130 formed on an epitaxial layer 129 formed in a recess region of a second active region 120.

All types of substrates in which selective epitaxial growth can be performed, excluding a silicon (Si) substrate and a silicon-on insulator (SOI) substrate, may be used as the semiconductor substrate 100.

An isolation region (not shown) is formed in the semiconductor substrate 100 to separate active regions 110 and 120 are to define the first and second conductivity type MOS transistors. The isolation region may be, for example, shallow trench isolation (STI) formed by trench-etching the semiconductor substrate 100. In addition, dopants for forming a well region (not shown) or channel regions 116 and 126 can be implanted into the active regions 110 and 120 of the first and second conductivity type MOS transistors.

The exemplary first conductivity type MOS transistor will now be described. A gate insulating layer 111 is formed on an active region 110 of the first conductivity type MOS transistor of the semiconductor substrate 100. The gate insulating layer 111 may be formed of one or more materials, such as $SiO_2$, SiON, SiN, and $Al_2O_3$. The thickness of the gate insulating layer 111 may vary from between 5 to 30 Å, including for example, 8 Å.

A gate electrode 112 is formed on the gate insulating layer 111. The gate electrode 112 may be formed of one or more materials, including, for example, polysilicon (poly-Si), silicon germanium (SiGe), and germanium (Ge).

A first spacer 113 is then formed on the sidewalls of the gate electrode 112. The first spacer 113 may be formed, for example, from silicon nitride.

Optionally, an oxide layer 114 may be formed between the sidewalls of the gate electrode 112 and the first spacer 113. The oxide layer 114 may be used to remove damage caused by the etching process typically used to form of the gate electrode 112. The oxide layer 114 may also be used to prevent dopants in the gate electrode 112 from out-diffusing. Such out-diffusing may degrade the long-term reliability of the gate electrode 112 by creating by a difference in thermal expansion coefficients of materials used to form the first spacer 113 and the gate electrode 112. The oxide layer 114 may be formed, for example, from silicon oxide.

An enhancer 115 is deposited on the entire surface of the above-described resultant structure. Here, the enhancer 115 is a layer adapted to provide a tensile or a compressive force to improve the mobility of electrons or holes in a channel region 116 formed below the gate electrode 112. The choice between tensile and compressive force will be defined by the type of the constituent transistor. By forming the enhancer 115, stress is generated in the active region covered by the enhancer 115 in the same direction of stress that exists in the enhancer 115. That is, when a tensile force is generated in the enhancer 115, the tensile force is applied to the active region formed below the enhancer 115, and when a compressive force is generated in the enhancer 115, the compressive force is applied to the active region formed below the enhancer 115.

Thus, assuming in one embodiment that the first conductivity type is n-type, the enhancer 115 formed on the first conductivity type MOS transistor may be formed from a tensile force-generating material, thereby inducing a tensile force upon the active region formed below the enhancer 115. Due to this applied tensile force, the mobility of electrons through the channel region 116 below the gate electrode 112 increases. The tensile force-generating materials readily adapted for use as the enhancer 115 include, as examples, SiN, SiON, etc.

Conversely, assuming in another embodiment that the first conductivity type is p-type, the enhancer 115 of the first conductivity type MOS transistor may be formed from a compressive force-generating material, thereby inducing a compressive force upon the active region formed below the enhancer 115. Due to this compressive force, the mobility of the holes through the channel region 116 below the gate electrode 112 increases. The compressive force-generating materials readily adapted for use as the enhancer 115 include $SiO_2$, etc.

In addition, the enhancer 115 prevents an epitaxial layer 129 from being formed on the first conductivity type MOS transistor when a selective epitaxial growth process is used to fill a recess region 128 of the second conductivity type MOS transistor, as described in some additional detail hereafter. In addition, the enhancer 115 may serve as an etch stop layer during the subsequent formation of contact holes.

The thickness of the enhancer 115 should be enough to generate a sufficient tensile force or compressive force in the active region formed below the enhancer 115 to prevent the formation of epitaxial layer 129 during the selective epitaxial growth process and to serve as an etch stop layer. For example, the thickness of the enhancer 115 may range from about 100 to 800 Å.

The first conductivity type MOS transistor further comprises a first conductivity type low-concentration source/drain region 117 aligned along both sidewalls of the gate electrode 112 and formed in the semiconductor substrate 100, and a first conductivity type high-concentration source/drain region 118 aligned along both sidewalls of the first spacer 113 and formed in the semiconductor substrate 100.

The exemplary second conductivity type MOS transistor will now be described. A gate insulating layer 121, a gate electrode 122, a first spacer 123, and (optionally) an oxide layer 124 that can be selectively formed between sidewalls of the gate electrode 122 and the first spacer 123 are similarly formed as with the first conductivity type MOS transistor.

However, the second conductivity type MOS transistor includes a double spacer comprising the first spacer 123 and a second spacer 125 formed on the first spacer 123. The second spacer 125 may be formed from the same material as that used to form the enhancer 115 of the first conductivity type MOS transistor. In such an embodiment, the second spacer 125 may be formed with a thickness ranging from about 100 to 700 Å.

The second conductivity type MOS transistor comprising the double spacer formed by the first and second spacers 123 and 125 is formed in such a way that the short channel effect otherwise caused by the high integration density of the constituent semiconductor device may be mitigated. The short channel effect is generated when ions implanted in the source and drain regions diffuse into a channel region, thereby reducing the effective electrical length of the channel otherwise defined by the material forming the channel and the physical distance between the source and drain regions. In particularly severe cases, the so-called punch-through phenomenon occurs, wherein the effective length of the channel disappears and current flows directly flows between the source and drain regions. When punch-through happens, the transistor becomes unreliable or useless as the gate operation becomes increasingly degraded.

In order to mitigate the short channel effect, the diffusion of ions into the channel region should be minimized, such that the effective length of the channel remains within its design parameters. Thus, a second conductivity type low-concentration source/drain region 127 of the second conductivity type MOS transistor, which will be described in some additional detail hereafter, is formed to be longer than in the prior art using the double spacer structure formed in the illustrated example by the first and second spacers 123 and 125. This also allows the high-concentration source/drain region 130 to be placed in such a manner that the effective length of channel is not reduced. Assuming in one embodiment that the second conductivity type is p-type, and further assuming that Boron (B) ions are implanted to respectively form the low-concentration and high-concentration source/drain regions 127 and 130, a severe risk of ion diffusion would normally occur. However, the risk of harmful ion diffusion and the resulting short channel effect may be prevented by the use of the double spacer structure (e.g., the first and second spacers 123 and 125).

In the illustrated example, the second conductivity type low-concentration source/drain region 127 is aligned along both sidewalls of the gate electrode 122 of the second conductivity type MOS transistor and formed in the semiconductor substrate 100. The second conductivity type high-concentration source/drain region 130 is aligned along both sidewalls of the second (outer) spacer 125 and formed under (i.e., to a greater depth than) epitaxial layer 129 filling a recess in the semiconductor substrate 100. The recess may be conventionally formed in any number of shapes in the semiconductor substrate 100.

Thus, the epitaxial layer 129 is filled into a recess region 128 aligned along both sidewalls of the second spacer 125 and formed in the semiconductor substrate 100, thereby constituting the second conductivity type high-concentration source/drain region 130. In one embodiment, the epitaxial layer 129 is formed in contact with the channel region 126 formed in the semiconductor substrate 100 below the gate insulating layer 121 of the second conductivity type MOS transistor. The epitaxial layer 129 may be formed from a tensile force or compressive force-generating material so as to improve the mobility of electrons or holes in the channel region 126.

For example, assuming in one embodiment that the second conductivity type is p-type, the lattice structure of the material forming epitaxial layer 129 may be the same as the material forming the semiconductor substrate 100 (e.g., silicon), or the material forming the epitaxial layer 129 may have a larger lattice structure that the material forming the semiconductor substrate 100. A material having the larger lattice structure (i.e., characterized by a larger lattice constant) will improve the mobility of holes by inducing a compressive force in a horizontal direction parallel to the channel region 126 (e.g., the epitaxial layer 129 may be formed from SiGe).

Conversely, assuming in another embodiment that the second conductivity type is n-type, the lattice structure of the material used to form the epitaxial layer 129 may be the same as the material used to form the semiconductor substrate 100 (e.g., silicon), or the material forming the epitaxial layer 129 may have a smaller lattice structure that the material forming the semiconductor substrate 100. As described above, a material having a relatively smaller lattice structure (e.g., a material having a smaller lattice constant) will improve the mobility of electrons by inducing a tensile force in a horizontal direction parallel to the channel region 126, (e.g., the epitaxial layer 129 may be formed from silicon carbide (SiC)).

An exemplary method of manufacture for a CMOS transistor according to an embodiment of the invention will now be described.

Figure 2:
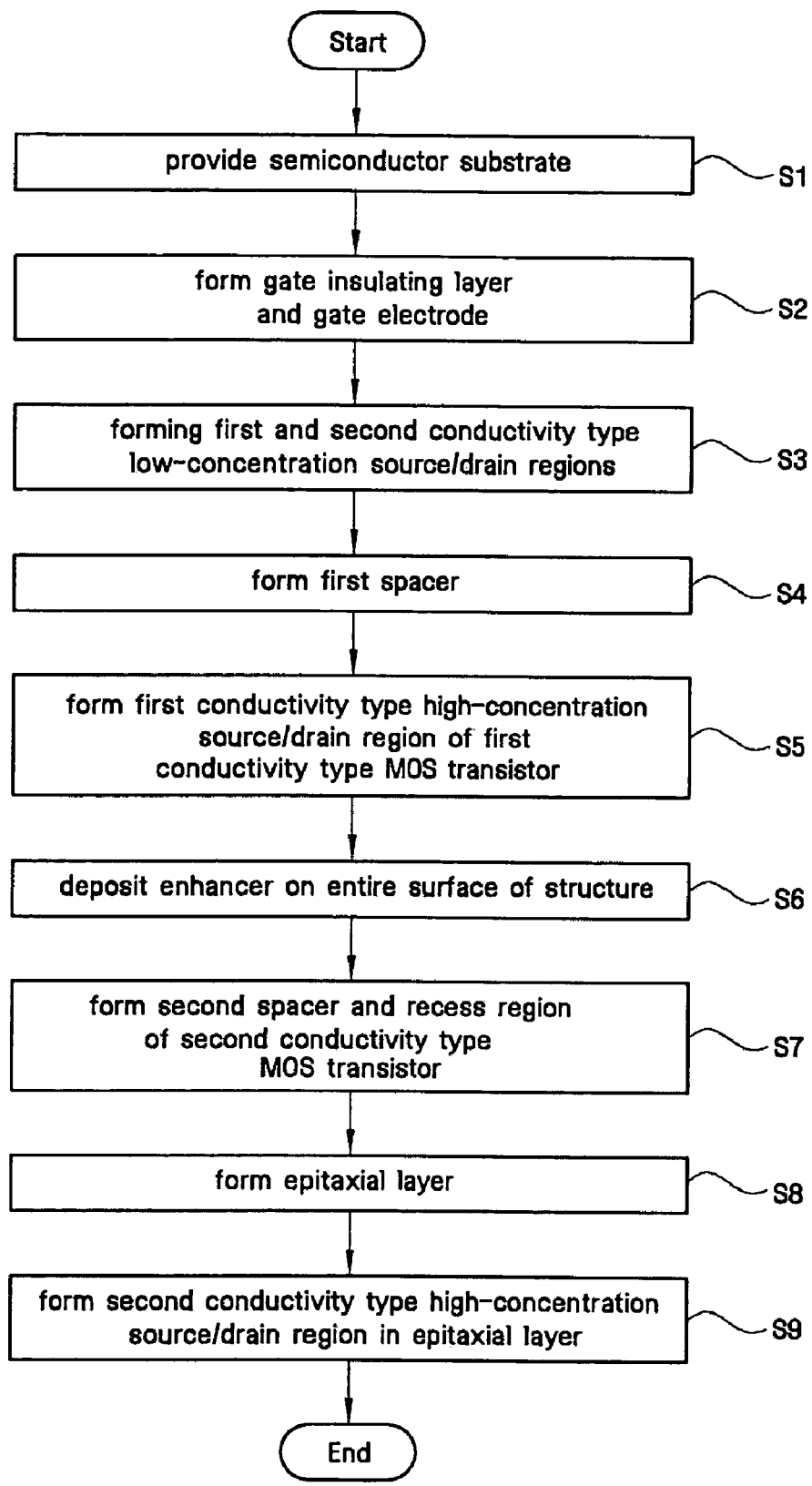
FIG. 2 is a flowchart illustrating a method of manufacturing a CMOS transistor according to an embodiment of the present invention.

FIG. 2 is a flowchart illustrating a method of manufacturing a CMOS transistor according to an embodiment of the invention. FIGS. 3 through 11 are related cross-sectional views further illustrating the method of manufacturing a CMOS transistor shown in FIG. 2.

Figure 3:
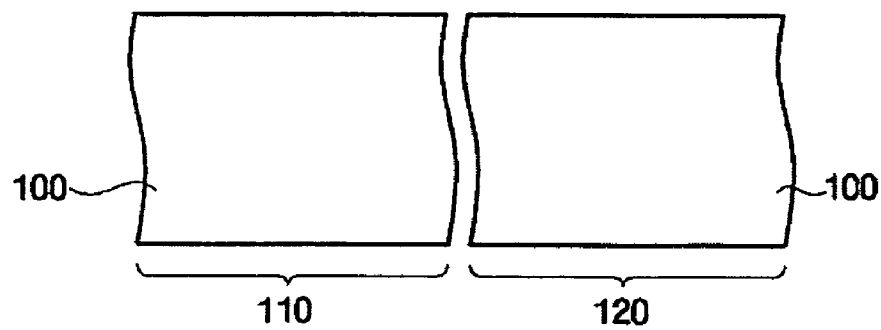
FIGS. 3 through 11 are cross-sectional views illustrating the method of manufacturing a CMOS transistor shown in FIG. 2.

Referring to FIG. 2, a semiconductor substrate 100 having active regions 110 and 120 adapted to receive the first and second conductivity type MOS transistors is provided (S1). See FIG. 3, illustrating a prepared semiconductor substrate 100. Of note, all types of substrates adapted to the inclusion of a selective epitaxial growth, excluding an Si substrate and an SOI substrate, may be used as the semiconductor substrate 100. A conventionally formed isolation region (not shown) may be used in the semiconductor substrate 100 to define the active regions 110 and 120 of the first and second conductivity type MOS transistors. For example, the isolation region may be STI formed by trench-etching the semiconductor substrate 100. Addition, at this time, dopants may be selectively implanted to form conventionally understood well region(s) (not shown) and/or channel region(s) (not shown) in the active regions 110 and 120 of the first and second conductivity type MOS transistors.

Figure 4:
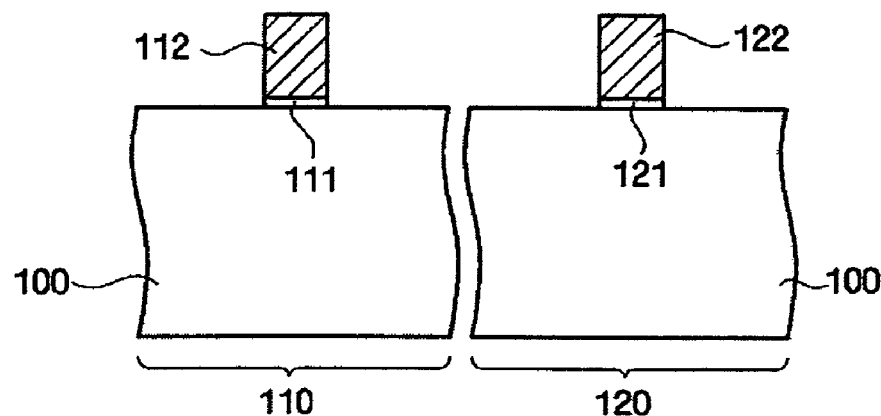

A gate electrode structure is next formed comprising a gate insulating layer and a gate electrode (S2). Referring to FIG. 4, the gate insulating layer is deposited on the active regions 110 and 120 of the first and second conductivity type MOS transistors on the semiconductor substrate 100. The gate insulating layer may be formed from one or more materials including, for example, $SiO_2$, SiON, SiN, and Al$_2$O$_3$, to a thickness of between about 5 to 30 Å, including for example, about 8 Å. Subsequently, a conductive layer adapted to the formation of the gate electrode is formed on the active regions 110 and 120 of the first and second conductivity type MOS transistors of the semiconductor substrate 100 in which the gate insulating layer is formed, using one or more materials, including for example, poly-Si, SiGe, and Ge. This conductive layer is deposited on the entire surface of the active regions 110 and 120, and thereafter an etching process using a mask defining the geometry of the gate electrode structure is performed, such that gate electrodes 112 and 122, as well as the patterned gate insulating layers 111 and 121 are formed.

Figure 5A:
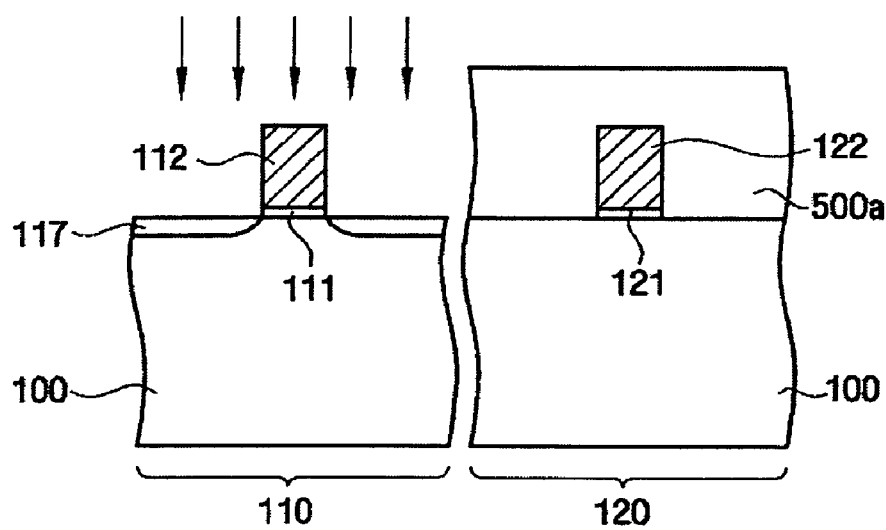

Subsequently, first and second conductivity type low-concentration source/drain regions are formed (S3). Referring to FIG. 5A, in order to form the first conductivity type low-concentration source/drain region 117 in the active region 110 of the first conductivity type MOS transistor, the active region 120 of the second conductivity type MOS transistor is shielded using a mask 500*a*, and ions are implanted into the active region 110 of the first conductivity type MOS transistor using the gate electrode 112 of the first conductivity type MOS transistor as an ion implantation mask.

First conductivity type ion implantation is basically performed and halo ion implantation may be selectively performed.

The first conductivity type ion implantation is performed to form the first conductivity type low-concentration source/drain region 117. Assuming in one embodiment that the first conductivity type is n-type, arsenic (As) ions, for example, may be implanted. However, assuming in another embodiment that the first conductivity type is p-type, Boron (BV) ions, for example, may implanted.

Halo ion implantation is implantation of ions that are an opposite type to ions used to form the source/drain region(s) so as to increase an impurity concentration of the active region of the semiconductor substrate after forming the gate electrode so as to prevent a punch-through phenomenon caused by a reduction in the length of the channel region. In the case of performing halo ion implantation, when the first conductivity type is n-type, halo ions are p-type ions and may be boron (B), for example. When the first conductivity type is p-type, halo ions are n-type ions, for example, arsenic (As).

Figure 5B:
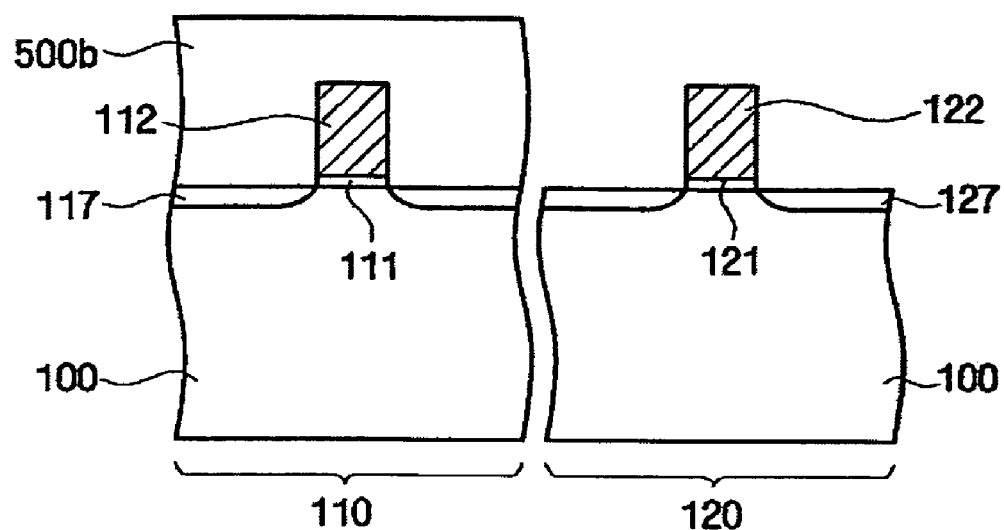

Referring to FIG. 5B, in order to form the second conductivity type low-concentration source/drain region 127 in the active region 120 of the second conductivity type MOS transistor, the active region 110 of the first conductivity type MOS transistor is shielded using a mask 500*b*, and ions are implanted into the active region 120 of the second conductivity type MOS transistor using the gate electrode 122 of the second conductivity type MOS transistor as an ion implantation mask.

Here, second conductivity type ion implantation is basically performed and halo ion implantation may be selectively performed.

The second conductivity type ion implantation is performed to form the second conductivity type low-concentration source/drain region 127. When the second conductivity type is n-type, ions are n-type ions and may be arsenic (As), for example. When the second conductivity type is p-type, ions are p-type ions and may be boron (B), for example.

In the case of performing halo ion implantation, when the second conductivity type is n-type, halo ions are p-type ions and may be boron (B), for example. When the second conductivity type is p-type, halo ions are n-type ions, for example, arsenic (B).

Figure 6:
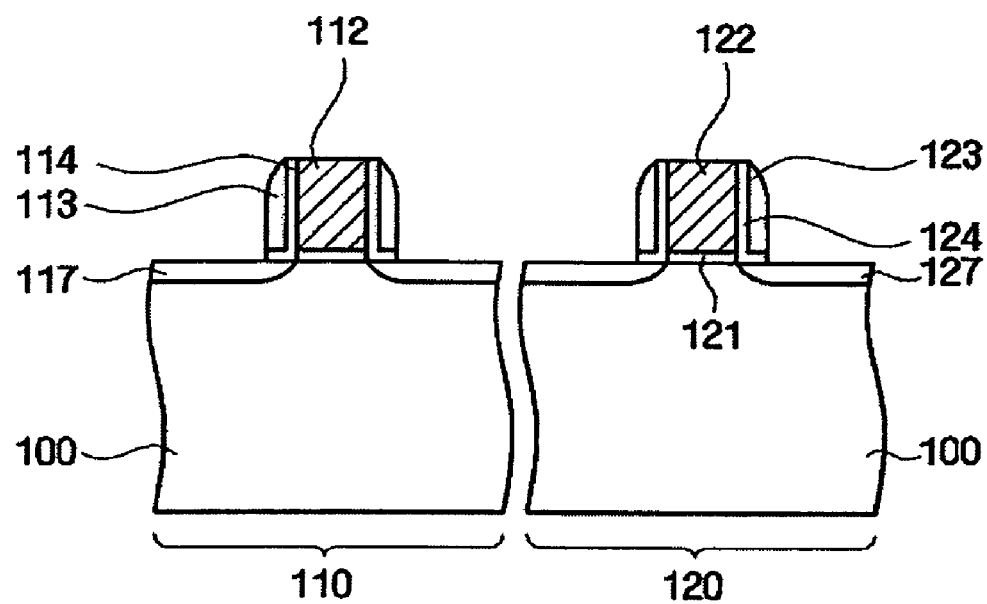

Next, first spacers are formed (S4). Referring to FIG. 6, an insulating layer adapted to form the first spacers 113 and 123, composed of, for example, silicon nitride is stacked on the entire surface of the semiconductor substrate 100 including on the gate electrodes 112 and 122 of the first and second conductivity type MOS transistors. Then, a conventional etching process is used to selectively etch back the insulating layer to respectively form the first spacers 113 and 123 on the sidewalls of the gate electrodes 112 and 122.

Optionally, when additional oxide layers 114 and 124 are formed between the sidewalls of the gate electrodes 112 and 122 and the first spacers 113 and 123, a chemical vapor deposition (CVD) process may be used to form an oxide layer on the entire resulting structure. Thereafter, the insulating layer used to form the first spacers 113 and 123 is deposited on the oxide layer. Then, the etch process is performed on the (e.g.,) nitride layer and oxide layer such that the oxide layers 114 and 124 are formed between the sidewalls of the gate electrodes 112 and 122 and the first spacers 113 and 123.

Figure 7:
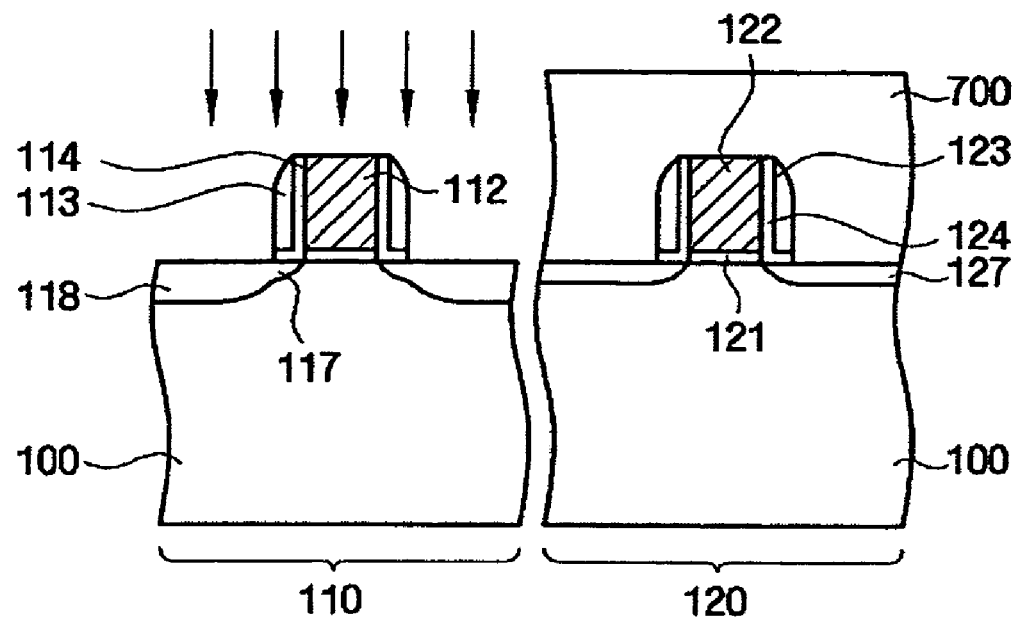

Subsequently, the first conductivity type high-concentration source/drain region of the first conductivity type MOS transistor is formed (S5). Referring to FIG. 7, the second conductivity type MOS transistor is shielded using a mask 700, and first conductivity type ions are implanted using the gate electrode 112 and the first spacer 113 of the first conductivity type MOS transistor as an ion implantation mask so that the first conductivity type high-concentration source/drain region 118 into which ions are implanted and which is aligned with the first spacer 113 is formed. When the first conductivity type is n-type, the first conductivity type ions may be arsenic (As), and when the second conductivity type is p-type, the first conductivity type ions may be boron (B).

Figure 8:
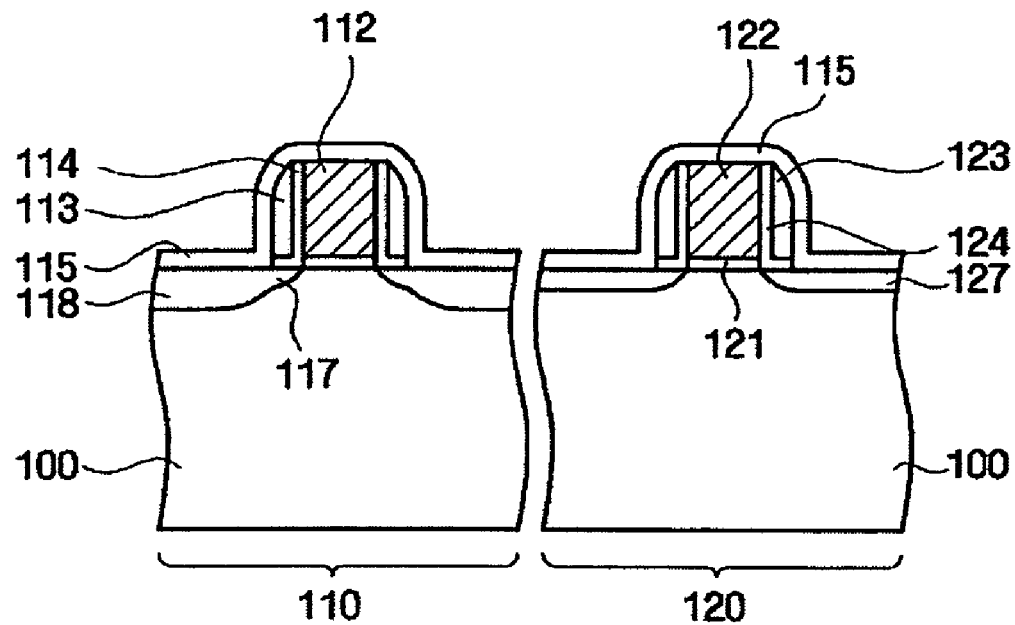

Subsequently, an enhancer is deposited on the entire resulting surface (S6). Referring to FIG. 8, the enhancer 115 may be deposited on the entire surface of the resulting structure using low pressure chemical vapor deposition (LP CVD) process. The enhancer 115 is a layer formed from a tensile force-generating or compressive force-generating material. For example, the tensile force-generating material may be SiN or SiON and the compressive force-generating material may be SiO$_2$.

The enhancer 115 provides conformal step coverage to the gate electrodes 112 and 114 and the spacers 113 and 123 of the first and second conductivity type MOS transistors. In this case, the enhancer 115 may be formed to a thickness ranging from about 100 to 800 Å.

Figure 9:
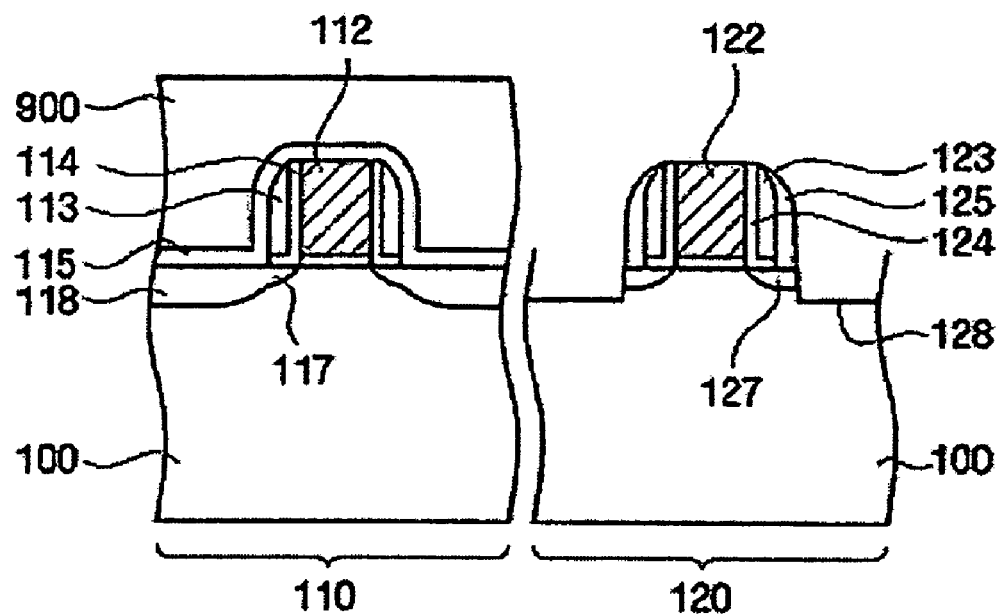

Subsequently, the second spacers and the recess region of the second conductivity type MOS transistor are formed (S7). Referring to FIG. 9, the first conductivity type MOS transistor is shielded using a mask 900 and the enhancer 115 formed on the second conductivity MOS transistor is processed using an etch back process so that the second spacer 125 is formed. In one embodiment, the active regions exposed by the double spacer comprising the gate electrode 122 and the first and second spacers 123 and 125 are etched so that the recess region 128 is formed in the active region 120 of the second conductivity type MOS transistor. Thus, the second spacer 125 and the recess region 128 may be simultaneously formed.

Figure 10:
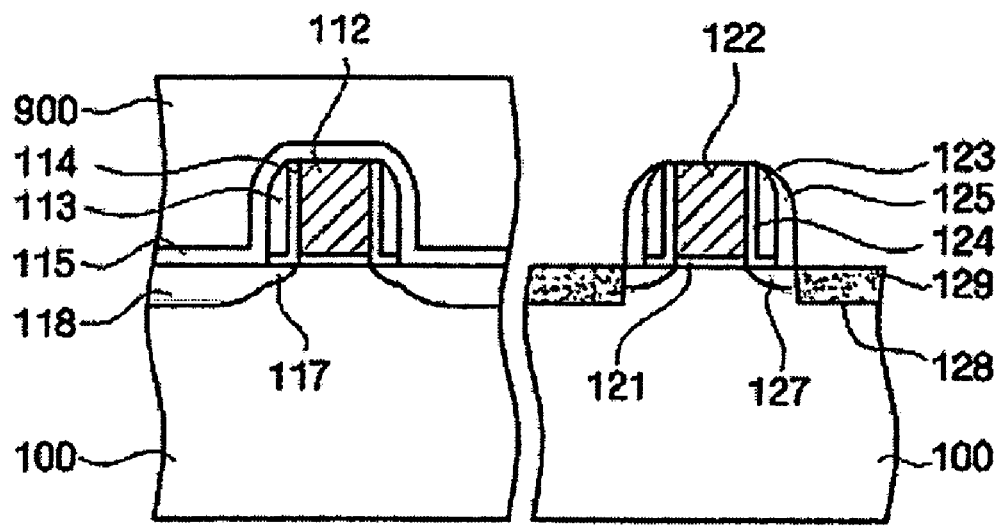

Subsequently, the epitaxial layer is formed (S8). Referring to FIG. 10, a selective epitaxial growth (SEG) process is performed on the active region 128 of the second conductivity type MOS transistor so that the recess region 128 is filled. SEG is not performed in the isolation region and is only performed in the active region. SEG may be performed using, as selected examples, a chemical vapor deposition (CVD), reduced pressure chemical vapor deposition (RPCVD) or ultra high vacuum chemical vapor deposition process.

The epitaxial layer 129 formed of a tensile force or compressive force-generating material is formed in the recess region 128 of the second MOS transistor by selective epitaxial growth. In this case, when the second conductivity type is p-type, the epitaxial layer 129 is formed of a compressive force-generating material, for example, silicon germanium (SiGe), in the recess region 128. In this case, the concentration of germanium may range from between about 5 to 30%. In addition, when the second conductivity type is n-type, the epitaxial layer 129 is formed of a tensile force-generating material, for example, SiC, in the recess region 128. In this case, the concentration of carbon may range from between about 5 to 30%.

In the selective epitaxial growth process wherein silicon (Si), germanium (Ge) or carbon (C) forms the epitaxial layer 129, $Si_2H_6$, $SiH_4$, $SiH_2Cl_2$, $SiHCl_3$, $SiCl_4$ or the like may be used as a source of Si, $GeH_4$ may be used as a source of Ge, and $C_2H_6$, $CH_3SiH_3$ or the like may be used as a source of C. In addition, in order to improve a selective characteristic, a gas such as HCl or $Cl_2$ may be added. If HCl is added, selective epitaxial growth in which the epitaxial layer 129 is not formed in the isolation region formed of an oxide layer or a nitride layer and is formed only in the region in which Si is exposed can be performed.

Figure 11:
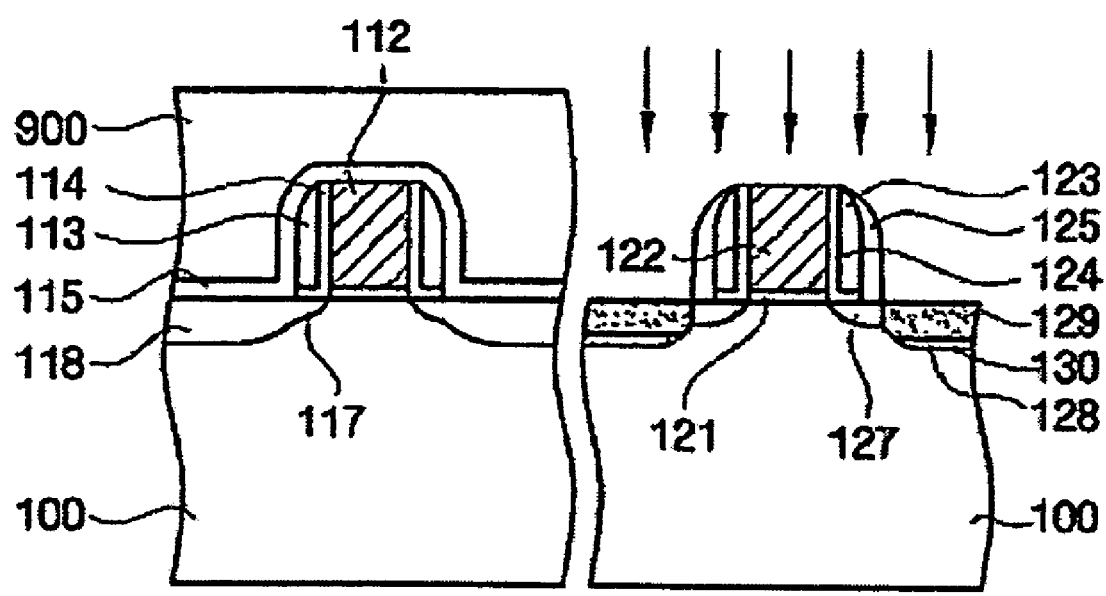

Subsequently, the second conductivity type high-concentration source/drain region is formed in the epitaxial layer (S9). Referring to FIG. 11, the second conductivity type high-concentration source/drain region 130 is formed in the epitaxial layer 129 in the recess region 128 of the second conductivity type MOS transistor. Some of the second conductivity type ions doping recess region 128 may disperse into semiconductor substrate 100 during a subsequently performed thermal treatment process. Under predetermined conditions, second conductivity type ions are implanted into the epitaxial layer 129 of the second conductivity type MOS transistor using the gate electrode 122 and the double spacer comprising the first and second spacers 123 and 125 of the second conductivity type MOS transistor as an ion implantation mask. In this case, the second conductivity type high-concentration source/drain region 130 of the second conductivity MOS transistor may be formed without blocking the first conductivity type MOS transistor using the enhancer 115 formed at the first conductivity type MOS transistor side.

Here, when the second conductivity type is p-type, the second conductivity type ions may be boron (B), and when the second conductivity type is n-type, the second conductivity type ions may be arsenic (As).

As described above, in the CMOS transistor and the related method of manufacture according to the present invention are characterized by a simplified manufacturing process, stress is appropriately applied to the channel regions of the first and second conductivity MOS transistors in opposite directions, such that the respective mobility of electrons and/or holes are improved in the channel region, and such that the performance characteristics of the first and second conductivity type MOS transistors are both improved.

In particular, when the second conductivity type is p-type, a double spacer comprising first and second spacers may be used as a spacer for the second conductivity type MOS transistor in which deterioration may occur due to the short channel effect, such that the effective length of the channel may maintained or increased and the characteristics of the constituent transistor improved.

Of further note, the term "on" is used to describe the formation of a layer or element directly on another layer or element, as well as on another layer or element with intervening layers or elements being present.

While the present invention has been particularly shown and described with reference to several exemplary embodiments thereof, it will be understood by those skilled in the art that various changes in form and details may be made therein without departing from the scope of the invention as defined by the following claims and equivalents thereof.

What is claimed is:

1. A Complementary Metal Oxide Semiconductor (CMOS) transistor comprising:
   first and second conductivity type transistors on a semiconductor substrate;
   wherein the first conductivity type transistor comprises:
   a gate electrode structure on the semiconductor substrate;
   a first spacer on sidewalls of the gate electrode structure;
   a first conductivity type low-concentration source/drain region aligned with a sidewall of the gate electrode structure and formed in the semiconductor substrate;
   a first conductivity type high-concentration source/drain region aligned with a sidewall of the first spacer and formed in the semiconductor substrate in electrical contact with the first conductivity type low-concentration source/drain region; and,
   an enhancer on the gate electrode structure, first spacer, first conductivity type low-concentration source/drain region and first conductivity type high-concentration source/drain region; and,
   wherein the second conductivity type transistor comprises:
   a gate electrode structure on the semiconductor substrate;
   a first spacer on sidewalls of the gate electrode structure;
   a second spacer at least in part on the first spacer and formed from the same material used to form the enhancer;
   a second conductivity type low-concentration source/drain region aligned with a sidewall of the gate electrode structure and in the semiconductor substrate;
   an epitaxial layer formed to fill least in part a recess in the semiconductor substrate aligned with a sidewall of the second spacer; and,
   a second conductivity type high-concentration source/drain region in the epitaxial layer.

2. The CMOS transistor of claim 1, wherein the enhancer is formed from a tensile force or compressive force-generating material.

3. The CMOS transistor of claim 2, wherein the enhancer is formed from a tensile force-generating material, the first conductivity type is n-type, and the second conductivity type is p-type.

4. The CMOS transistor of claim 2, wherein the enhancer is formed from a compressive force-generating material, the first conductivity type is p-type, and the second conductivity type is n-type.

5. The CMOS transistor of claim 2, wherein the tensile force-generating material is SiN or SiON.

6. The CMOS transistor of claim 2, wherein the compressive force-generating material is $SiO_2$.

7. The CMOS transistor of claim 1, wherein the enhancer has a thickness ranging from between about 100 to 800 Å.

8. The CMOS transistor of claim 1, wherein the second spacer has a thickness ranging from about 100 to 700 Å.

9. The CMOS transistor of claim 1, wherein the epitaxial layer is formed from a tensile force or a compressive force-generating material.

10. The CMOS transistor of claim 9, wherein the epitaxial layer is formed from a compressive force-generating material, the first conductivity type is n-type, and the second conductivity type is p-type.

11. The CMOS transistor of claim 9, wherein the epitaxial layer is formed from a tensile force-generating material, the first conductivity type is p-type, and the second conductivity type is n-type.

12. The CMOS transistor of claim 9, wherein the compressive force-generating material is SiGe.

13. The CMOS transistor of claim 9, wherein the tensile force-generating material is SiC.

14. The CMOS transistor of claim 1, wherein the first and second conductivity type transistors each further comprise an oxide layer between the first spacer and the sidewall of the gate electrode structure.

15. The CMOS transistor of claim 14, wherein the oxide layer is formed from silicon oxide.

* * * * *